United States Patent
Visneski et al.

(10) Patent No.: US 11,482,802 B2
(45) Date of Patent: Oct. 25, 2022

(54) HIGH SPEED TRACELESS INTERCONNECT

(71) Applicant: Cisco Technology, Inc., San Jose, CA (US)

(72) Inventors: Jason Visneski, San Jose, CA (US); George Edward Curtis, San Jose, CA (US); Mike Sapozhnikov, San Jose, CA (US); Peter Gunadisastra, Palo Alto, CA (US); Joel Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/333,925

(22) Filed: May 28, 2021

(65) Prior Publication Data

US 2022/0181807 A1 Jun. 9, 2022

Related U.S. Application Data

(60) Provisional application No. 63/121,350, filed on Dec. 4, 2020.

(51) Int. Cl.
*H05K 1/11* (2006.01)
*H05K 3/34* (2006.01)
(Continued)

(52) U.S. Cl.
CPC ............ *H01R 12/53* (2013.01); *H05K 1/114* (2013.01); *H05K 1/181* (2013.01); *H05K 3/3436* (2013.01);
(Continued)

(58) Field of Classification Search
CPC ........ H01R 12/53; H05K 1/114; H05K 1/181; H05K 3/3436
See application file for complete search history.

(56) References Cited

U.S. PATENT DOCUMENTS 10,076,033 B1  9/2018 Reynov et al.
2003/0197198 A1 10/2003 Panella et al.
(Continued)

FOREIGN PATENT DOCUMENTS

CN   111384609 A   7/2020
WO   2016082518 A1  6/2016

OTHER PUBLICATIONS

Altium, "Controlled Depth Drilling, or Back Drilling", https://www.altium.com/documentation/altium-designer/controlled-depth-drilling-or-back-drilling-ad?version=18.1#!drill-depth, downloaded from Internet Feb. 11, 2021, 17 pages.

(Continued)

*Primary Examiner* — Jeremy C Norris
(74) *Attorney, Agent, or Firm* — Edell, Shapiro & Finnan, LLC

(57) ABSTRACT

An apparatus includes a printed circuit board (PCB). The PCB includes a plurality of through-holes extending through the PCB between a PCB first surface and a PCB second surface that opposes the PCB first surface, where each through-hole includes a via extending from the PCB first surface to a depth within the through-hole that is distanced from the PCB second surface. An integrated circuit surface mount is connected at the PCB first surface with vias of the through-holes, and a cable interconnect assembly is surface mount connected at the PCB second surface. The cable interconnect assembly includes a plurality of contact pins, each contact pin extending within a corresponding through-hole and having a sufficient dimension to engage and electrically connect with the via of the corresponding through-hole so as to facilitate exchange of an electrical signal between the integrated circuit and the cable interconnect assembly.

20 Claims, 10 Drawing Sheets

(51) Int. Cl.
*H01R 12/53* (2011.01)
*H05K 1/18* (2006.01)

(52) U.S. Cl.
CPC .............. *H05K 2201/09545* (2013.01); *H05K 2201/09827* (2013.01); *H05K 2201/09854* (2013.01); *H05K 2201/10303* (2013.01); *H05K 2201/10356* (2013.01); *H05K 2201/10734* (2013.01)

(56) References Cited

U.S. PATENT DOCUMENTS

| | | |
|---|---|---|
| 2014/0055873 A1 | 2/2014 | Fretts |
| 2014/0225637 A1 | 8/2014 | Ao et al. |
| 2014/0322985 A1 | 10/2014 | Gulla |
| 2015/0372403 A1 | 12/2015 | Lam et al. |
| 2016/0150645 A1 | 5/2016 | Gailus et al. |
| 2017/0265296 A1 | 9/2017 | Charbonneau et al. |

OTHER PUBLICATIONS

Molex, "BiPass I/O High-Speed Solutions", https://www.molex.com/molex/products/family/bipass_io_and_backplane_cable_assemblies, downloaded from Internet Mar. 29, 2021, 3 pages.
Samtec, "Flyover® QSFP28 Cable Systems", https://www.samtec.com/cables/high-speed/assemblies/qsfp-flyover, downloaded Mar. 29, 2021, 16 pages.

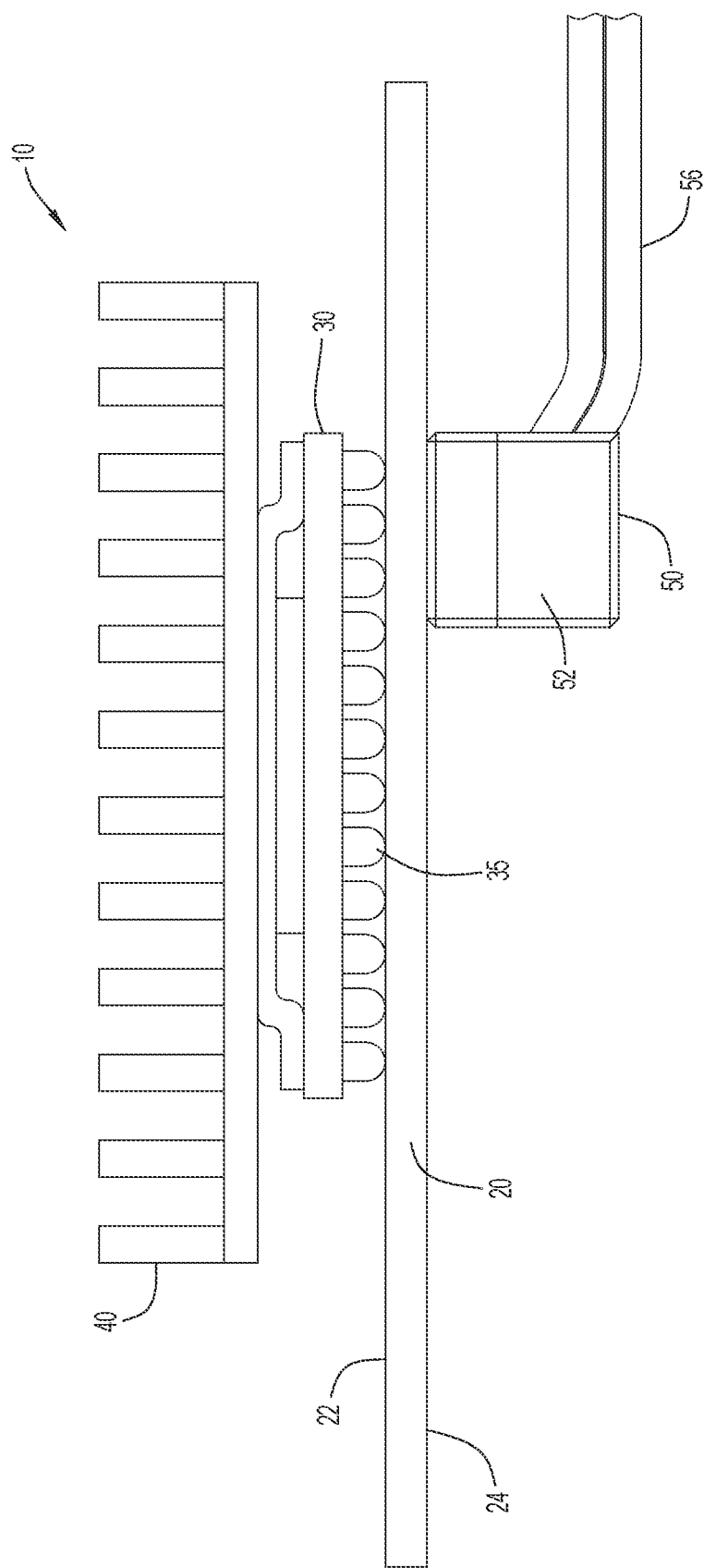

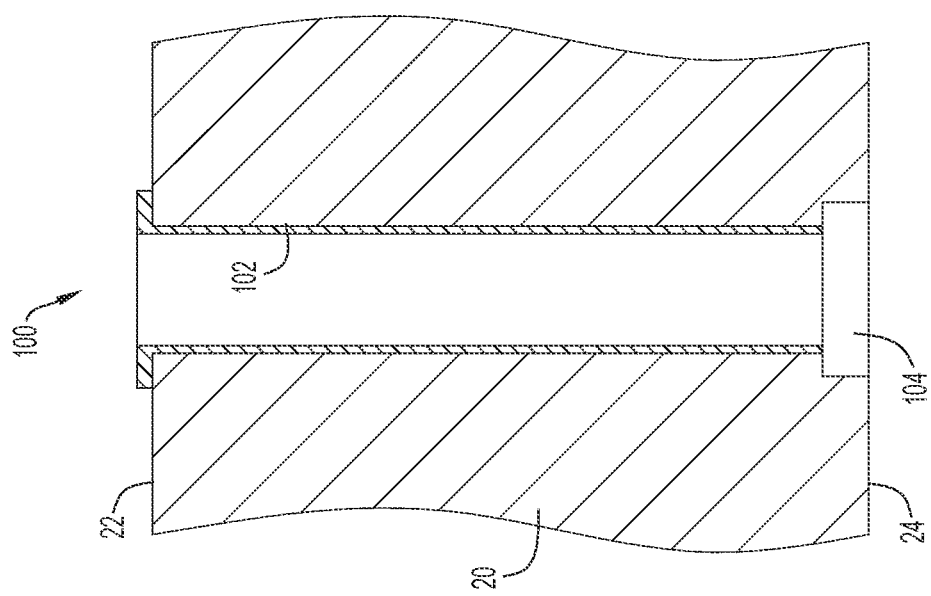

HIGH SPEED TRACELESS INTERCONNECT

CROSS REFERENCE TO RELATED APPLICATION

This application claims priority under 35 U.S.C. § 119(e) to U.S. Provisional Patent Application Ser. No. 63/121,350, entitled "High Speed Traceless Interconnect", filed Dec. 4, 2020, the disclosure of which is incorporated herein by reference in its entirety for all purposes.

TECHNICAL FIELD

The present disclosure relates to interconnect arrangements in computing and other electronic equipment.

BACKGROUND

For many networking equipment and computing systems, higher speed (e.g., 56 and 112 Gbps) signaling requirements have pushed beyond the capabilities of current low-cost printed circuit board (PCB) materials. Using a higher performance PCB material not only costs more, but may also prevent a manufacturer from using a low cost supply and manufacturing base further increasing the cost.

The cost for the PCB fabrication increases substantially when higher performance materials are used. For some systems, even these expensive materials cannot meet the performance requirements.

There have been cabled interconnect solutions developed, but they still have drawbacks. They still require traces routed on the PCB which could consume almost half of the loss budget. Cable interconnects also consume a large physical area on the PCB which may impair power delivery to the chip and the ability to route other signals. Some versions require modifications to heat sinks that make cooling solutions less effective and/or costlier.

BRIEF DESCRIPTION OF THE DRAWINGS

FIG. 1 is a side view of a printed circuit board (PCB) with Application Specific Integrated Circuit (ASIC) disposed at a top surface of the PCB and a cable interconnect assembly disposed at a bottom surface of the PCB according to an example embodiment, where the cable interconnect assembly is press-fit to the PCB to facilitate an electrical connection therewith for exchanging signals with the ASIC during PCB operations.

FIG. 4 is a schematic views of an example embodiment showing a construction of a through-hole and corresponding via for a PCB that shortens the plated portions of the through-hole according to methods as described herein.

FIG. 7 illustrates individual differential signal pair bundles arranged as modular repeated elements to allow for Serializer/Deserializer (SERDES) lane mapping/swapping in the cable bundle instead of uncrossing in the PCB routing, according to an example embodiment.

DESCRIPTION OF EXAMPLE EMBODIMENTS

Overview

Figure 2A:
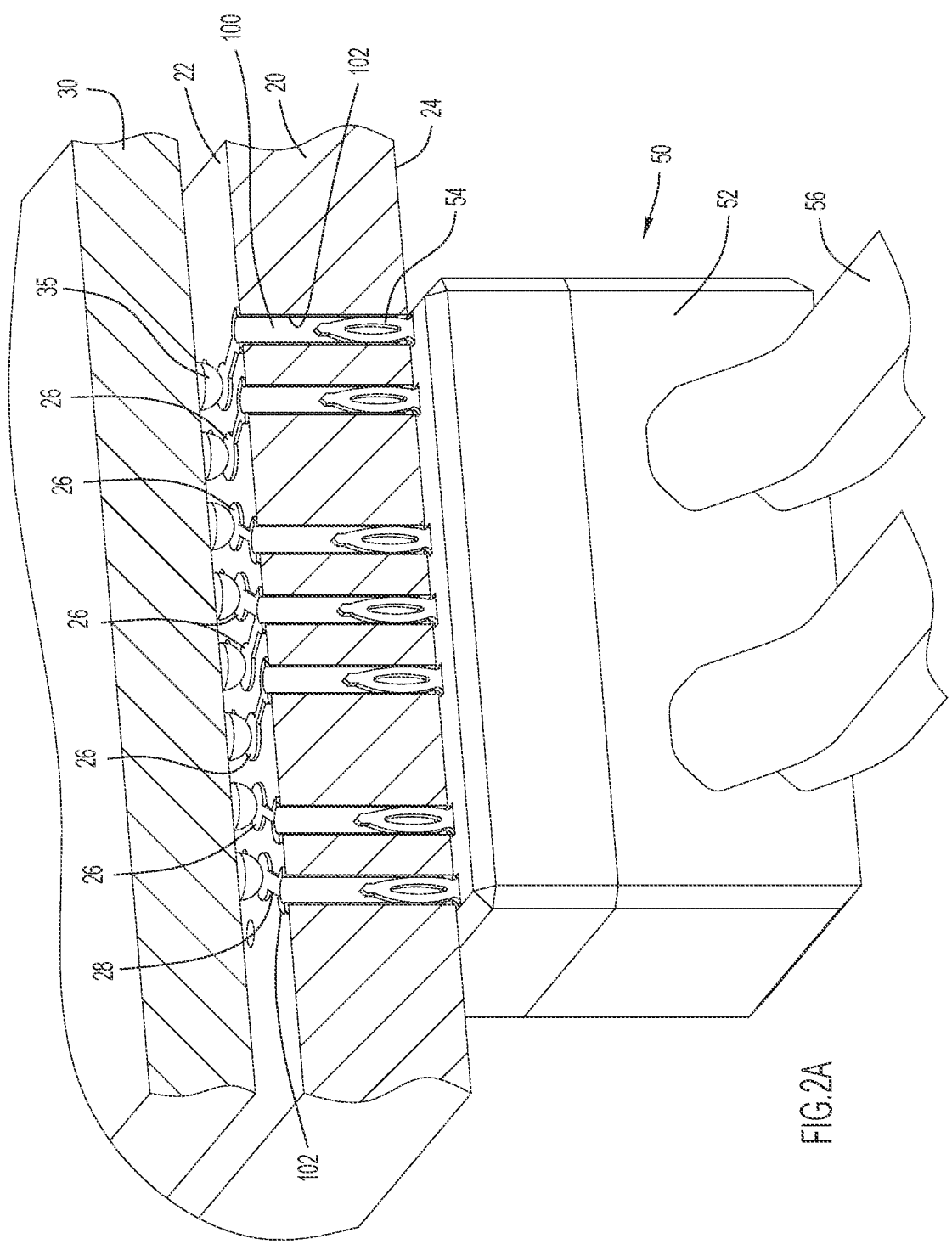
FIG. 2A is a perspective view in partial cross-section of a portion of the PCB and the cable interconnect assembly of FIG. 1.
Figure 2B:
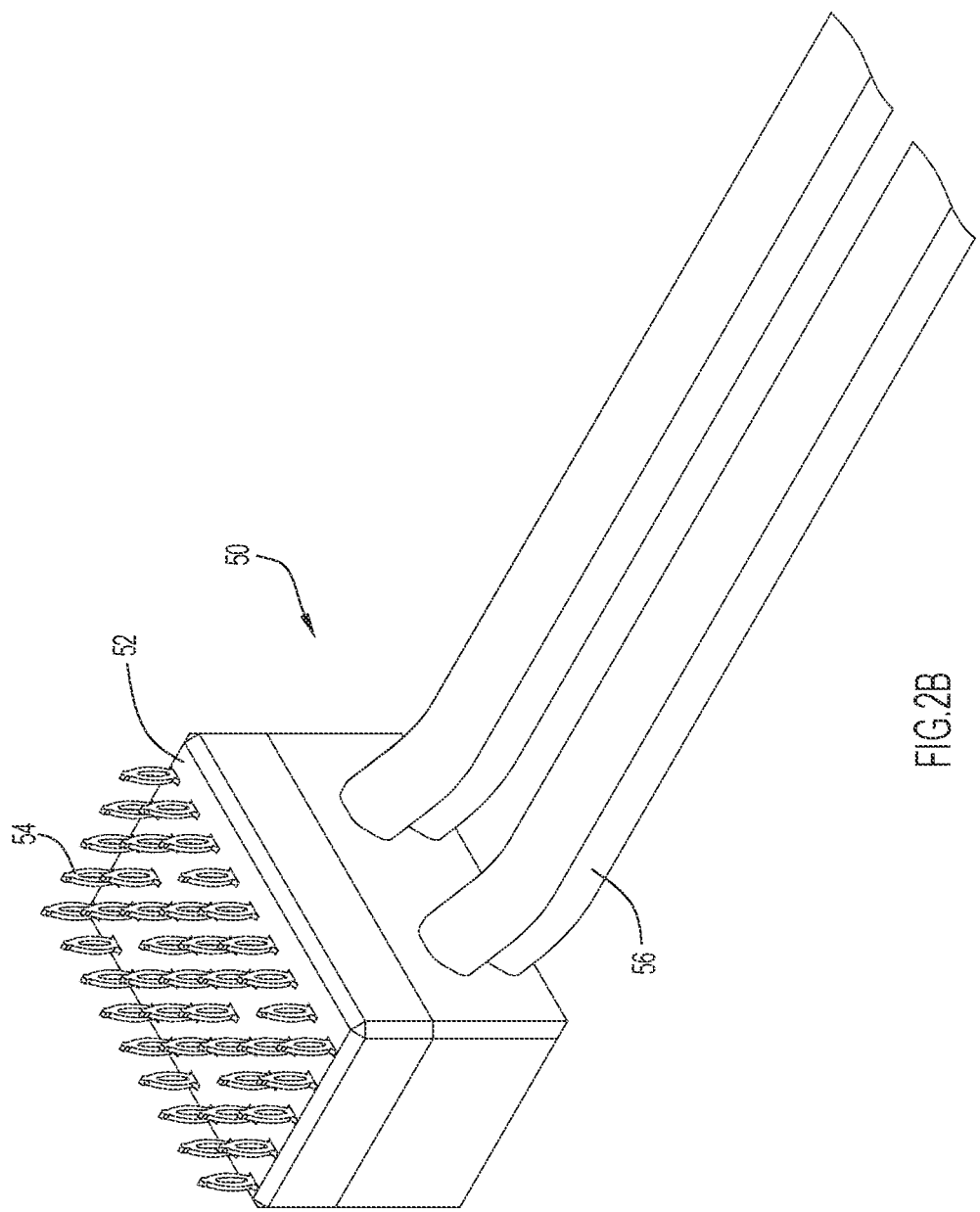
FIG. 2B is a perspective view showing the cable interconnect assembly of FIG. 1.

In an embodiment, an apparatus comprises a printed circuit board (PCB) comprising a plurality of through-holes extending through the PCB between a PCB first surface and a PCB second surface that opposes the PCB first surface, where each through-hole includes a via extending from the PCB first surface to a depth within the through-hole that is distanced from the PCB second surface. An integrated circuit surface mount is connected at the PCB first surface with vias of the through-holes, and a cable interconnect assembly is surface mount connected at the PCB second surface. The cable interconnect assembly includes a plurality of contact pins, each contact pin extending within a corresponding through-hole and having a sufficient dimension to engage and electrically connect with the via of the corresponding through-hole so as to facilitate exchange of an electrical signal between the integrated circuit and the cable interconnect assembly.

In another embodiment, a printed circuit board (PCB) comprises a plurality of through-holes extending through the PCB between a PCB first surface and a PCB second surface that opposes the PCB first surface, and a plurality of vias, where each via extends from the PCB first surface to a depth within the through-hole that is distanced from the PCB second surface. A plurality of contact pads are at the PCB first surface, where each contact pad is electrically connected with a corresponding via, and at least one via electrically connects with a plurality of contact pads at the PCB first surface.

In a further embodiment, a method comprises mounting an integrated circuit component to a PCB first surface of a printed circuit board (PCB) such that the integrated circuit component connects with contact pads at the PCB first surface, where the PCB comprises a plurality of through-holes extending through the PCB between the PCB first surface and a PCB second surface that opposes the PCB first surface, and each through-hole includes a via extending from the PCB first surface to a depth within the through-hole that is distanced from the PCB second surface, each via further connecting with a corresponding contact pad at the PCB first surface. The method further comprises facilitating a connection of a cable interconnect assembly at the PCB second surface, the cable interconnect assembly including a plurality of contact pins, each contact pin extending within a corresponding through-hole and having a sufficient dimension to engage and electrically connect with the via of the corresponding through-hole so as to facilitate exchange of an electrical signal between the integrated circuit and the cable interconnect assembly.

EXAMPLE EMBODIMENTS

Described herein is an apparatus or system that facilitates a press-fit connection of a cable interconnect assembly with a printed circuit board (PCB) at one (e.g., bottom) side or surface of the PCB in relation to one or more integrated circuit (IC) components disposed at an opposing (e.g., top) side or surface of the PCB, where the press-fit connection of the cable interconnect assembly facilitates a transfer of electrical signals between the one or more IC components and the cable interconnect assembly during PCB operations.

In an example embodiment, the apparatus includes a PCB with an Application Specific Integrated Circuit (ASIC) connected via a suitable surface mount contact connection at a first or top surface of the PCB, and a cable interconnect assembly that press-fit connects at a second or bottom surface of the PCB to facilitate an exchange of electrical signals between ASIC and cable interconnect assembly. In the example embodiments depicted in the drawings, the ASIC electrically connects with a ball grid array (BGA) surface mount connection (e.g., solder connection) to contact pads also arranged in an array along the PCB top surface (where the contact pads are connected with vias in the PCB). The PCB via arrangement is configured such that the cable interconnect assembly can be disposed directly beneath or below the ASIC (i.e., at least a portion of the areal footprint along the PCB second surface that is occupied by the cable interconnect assembly is located below at least a portion of the areal footprint along the PCB first surface that is occupied by the ASIC). The PCB via configuration, as described herein, substantially minimizes trace path lengths along and/or within the PCB between electrical contact pins of the cable interconnect assembly and corresponding contacts of the ASIC (or other integrated circuit connecting with the cable interconnect assembly).

Referring to FIGS. 1, 2A, 2B, 3A, 3B and 6, an example embodiment of an apparatus 10 is depicted comprising a printed circuit board (PCB) 20 including a first or top surface 22 and a second or bottom surface 24. Any suitable number and types of circuit components can be connected with the PCB depending upon apparatus operations to be performed. The apparatus can be implemented as part of a computing device (e.g., a networking device) or any other suitable type of electronic device that requires high signal speeds/high data transmission rates (e.g., utilizing SerDes circuit operations).

The PCB 20 can include any number of layers forming levels at varying depths from the top surface 22 and further including any selected number and patterns of electrically conductive traces at varying levels/depths of the PCB. The PCB further includes through-holes 100 extending through the PCB and between the top surface 22 and the bottom surface 24 with electrically conductive plating in the through-holes forming vias 102 that extend from the PCB top surface to a selected depth within the PCB as described herein. As described herein, the vias facilitate electrical contact connections between components connected with the PCB (e.g., at the top surface 22 and/or the bottom surface 24), where electrical traces can also be formed at the top and/or bottom PCB surfaces as well as at varying levels/ depths of the PCB that connect with one or more vias. The electrically conductive traces and vias that facilitate electrical connections between PCB components can comprise copper and/or any other suitably electrically conductive materials.

An integrated circuit component in the form of an ASIC 30 connects with the PCB 20 at the top surface 22. A heat sink system 40 (e.g., including fins and any other suitably air, liquid and/or any other suitable cooling components) can be connected with the ASIC 30 to provide cooling to the ASIC during operation.

Figure 6:
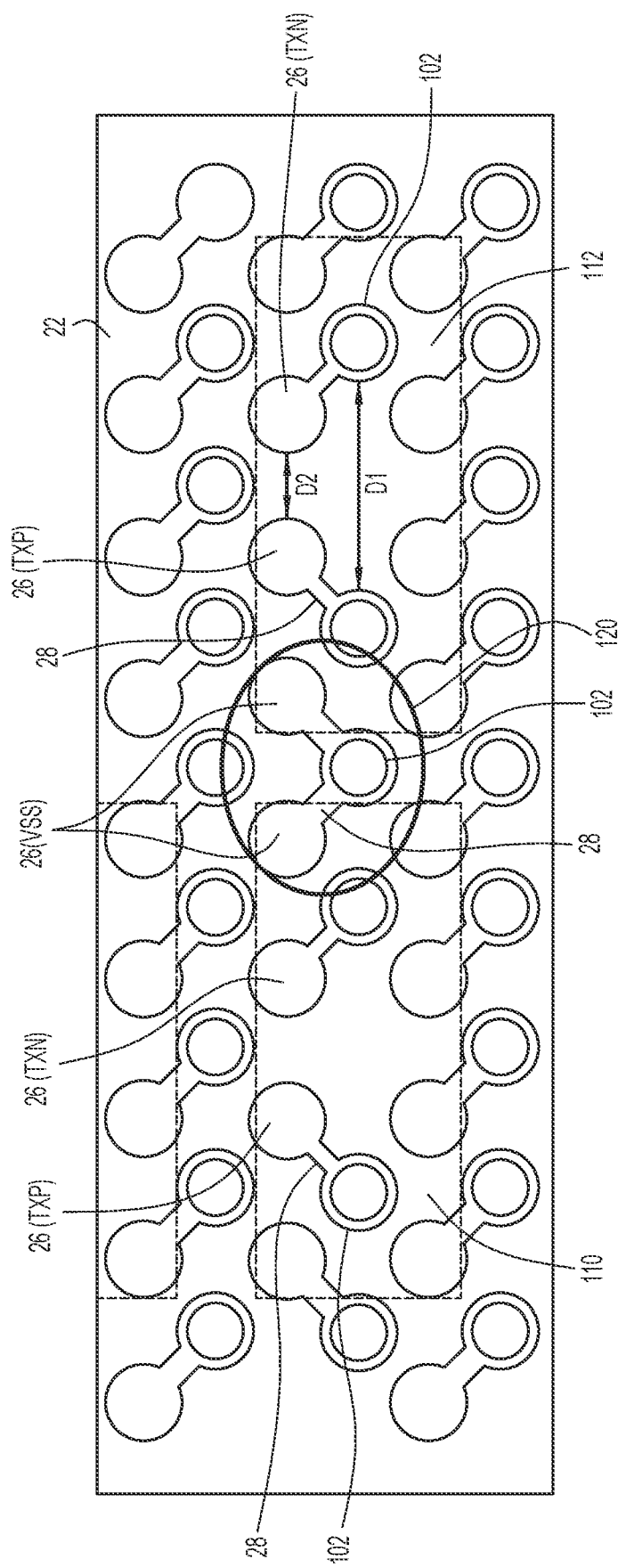
FIG. 6 depicts a view of a portion of the top surface of the PCB of FIG. 1 including an arrangement of contact pads and vias to facilitate differential signaling according to an example embodiment, and further showing sharing by two (2) ball grid array (BGA) ball connections between ASIC and PCB with a single via at locations between adjacent differential signal pairs.

The ASIC 30 can surface mount connect with the PCB 20 in any suitable manner to facilitate transfer of electrical signals between ASIC and PCB during operation of the apparatus or electronic device. In an example embodiment, as depicted in the figures, the ASIC 30 includes surface mount connection structure in the form of a ball grid array (BGA) 35, where the BGA 35 comprises electrically conductive metal (e.g., copper) balls that surface mount connect with corresponding contact pads 26 (e.g., via a solder connection or any other suitable press-fit connection) disposed at the top surface 22 in the manner described herein. The contact pads 26 of the PCB 20 can also comprise copper and/or any other suitably electrically conductive metal. The contact pads 26 are arranged in a suitable alignment or array along the top surface 22 of the PCB 20 so as to correspond and engage with corresponding conductive balls of the BGA 35 of the ASIC 30 when the ASIC is connected with the PCB. Referring to FIG. 6 (which shows a portion of the top surface 22 of the PCB at a location including two differential via pairs), each contact pad 26 includes a small trace 28 extending from the contact pad 26 to a via 102 within a through-hole 100 so as to electrically connect contact pad 26 with the electrically conductive via 102 (FIG. 2A). The contact pads 26, through-holes 100 and corresponding vias 102 are further arranged along the PCB to facilitate sharing of a single via of the PCB by a plurality of BGA ball connections of the ASIC and to further allow for suitable spatial separation between vias associated with differential signal pairs in a manner as described herein.

A cable interconnect assembly 50 is constructed so as to facilitate a press-fit connection with the PCB 20 at its bottom surface 24. The cable interconnect assembly 50 includes a generally rectangular main housing 52 including a top surface from which a plurality of elongated contact pins 54 extend. Each contact pin 54 has a suitable length and a suitable transverse cross-sectional geometry that is shaped and dimensioned to fit within a corresponding through-hole 100 at the bottom surface 24 of the PCB 20. In addition, and as shown in FIGS. 2A and 3B, the dimensions of the contact pins 54, through-holes 100, and vias 102 and formed within the through-holes 100 are suitably dimensioned such that a press-fit connection that secures the cable interconnect assembly 50 to the bottom surface 24 of the PCB 20 ensures an adequate electrical contact between each contact pin 54 and the electrically conductive via 102 within a corresponding through-hole 100. As shown in the figures, each contact pin 54 can have a generally flat elongated shape that bows slightly outward at a central or mid region of the contact pin. Each contact pin 54 can further have a suitable flexibility to slightly compress or flex against inner wall surface portions of a corresponding through-hole 100 when inserted within the through-hole, which ensures a sufficient engagement and contact with the via 102 within the through-hole.

Cables 56 extend from an end of the main housing 52 of the cable interconnect assembly 50. The cables 56 include conductive signal wires electrically connected and corresponding with the contact pins 54, where each cable 56 houses and insulates or shields one or more signal wires. The cables 56 can include any suitable connector at the terminal ends of the cables to facilitate a suitable connection with one or more other components of the PCB 20 and/or other structure of the electronic device.

The PCB 20 is constructed with through-holes 100 such that vias 102 of the through-holes do not entirely traverse the PCB from its top surface 22 to its bottom surface 24. As shown in the example embodiment of FIGS. 2A, 3A and 3B, each through-hole 100 that receives a contact pin 54 of the cable interconnect assembly 50 includes an electrical contact portion or electrically conductive via 102 that extends from the PCB top surface 22 (where the via 102 is in electrical contact with a corresponding trace 28 and contact pad 26) to a depth that only partially extends along or within the via. In other words, the via 102 of each through-hole 100 does not extend the full distance or length of the through-hole and therefore terminates within the through-hole a distance from the PCB bottom surface 24.

Figure 3A:
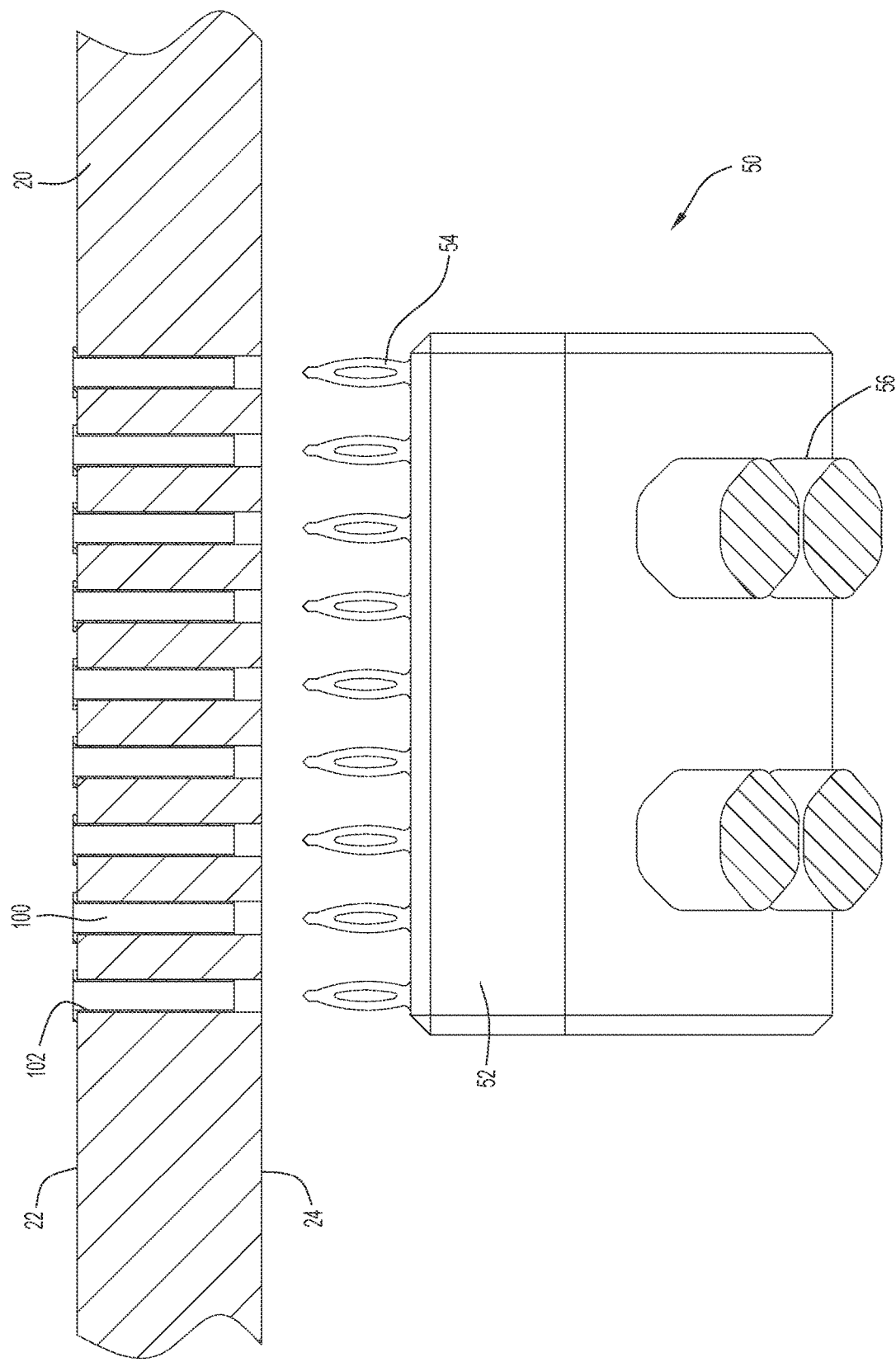
FIG. 3A depicts a cross-sectional side view in partial cross-section of a portion of the PCB with cable interconnect assembly of FIG. 1 according to an embodiment, where the cable interconnect assembly is separated from the PCB.
Figure 3B:
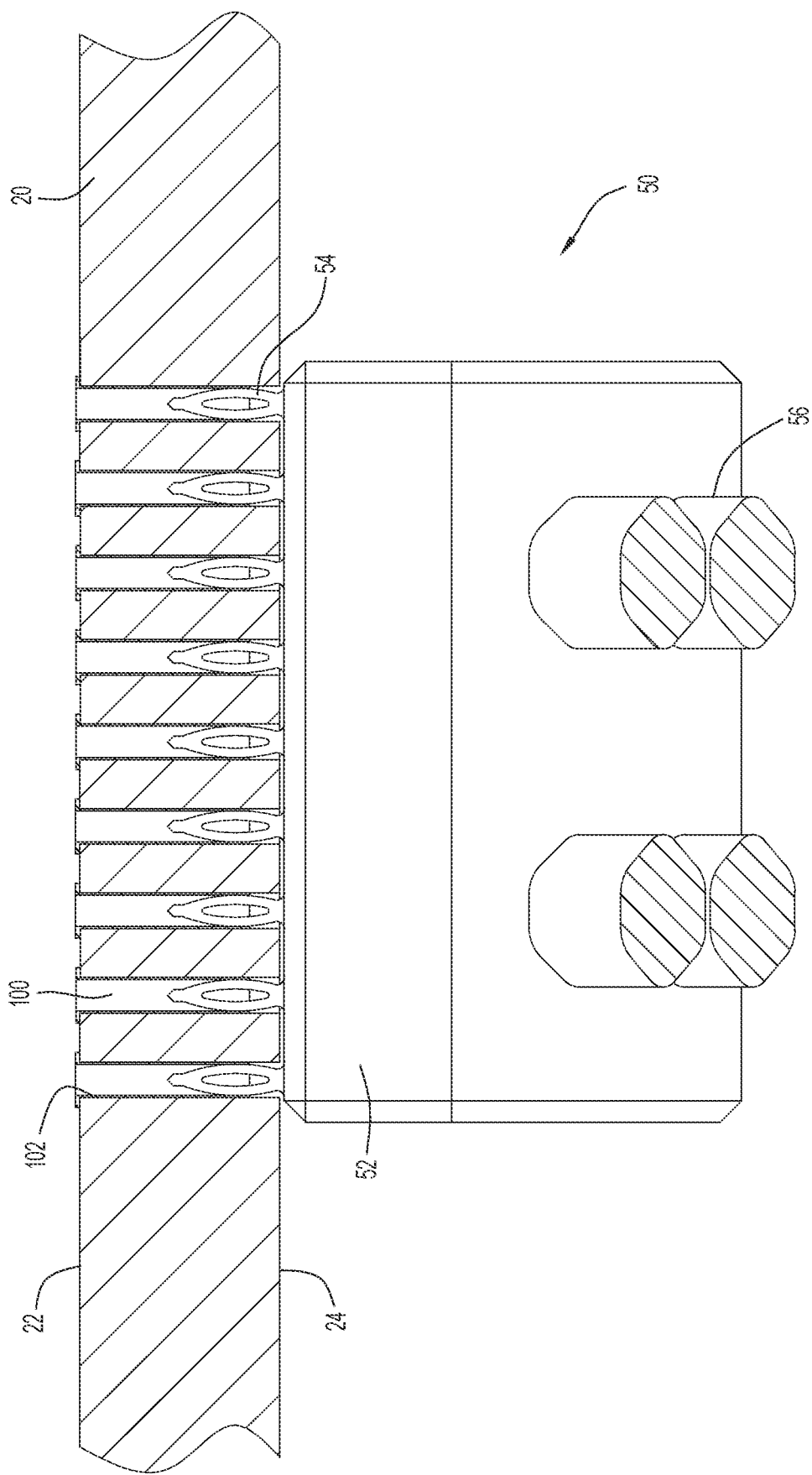
FIG. 3B depicts the view of FIG. 3A with cable interconnect assembly connected with the PCB such that contact pins of cable interconnect assembly extend within and engage with the partially extending electrical contact (partially plated hole) portions of the vias.

There are a number of techniques that enable formation of an electrically conductive portion of a through-hole or via that extends only a portion of the length of the through-hole, such as the vias 102 shown in FIGS. 2A, 3A and 3B. In an example embodiment, a through-hole can be formed and then plated (e.g., plated with copper and/or other electrical conductive metal material to form a plated through-hole), followed by back-drilling (controlled depth drilling) or boring the through-hole at the bottom surface of the PCB to remove any plating material from the through-hole a selected depth from the PCB bottom surface. In other example embodiments, any sort of etch removal technique (e.g., mechanical, chemical and/or plasma etching) can be utilized to selectively remove plated material in the through-hole at the bottom surface of the PCB to a desired depth. In still other example embodiments, the plating of the through-hole can be selectively controlled such that the via only forms to a certain depth within the through-hole. In essence, any suitable technique can be utilized that facilitates formation of a via that extends only through a portion of a through-hole (leaving a selected length from the PCB bottom surface to within a desired depth of the through-hole being non-plated/non-electrically conductive).

Some non-limiting example embodiments of through-holes that form vias extending a partial length of the through-hole (from the PCB top surface) are depicted in FIGS. 4 and 5A-5D. Referring to FIG. 4, a through-hole bore or counterbore 104 can be formed in the through-hole 100, e.g., by back drilling at the bottom surface 24 of the PCB 20 after the through-hole has been plated. The counterbore 104 of the through-hole 100 has a larger diameter or transverse cross-section than the electrically conductive via 102. In another embodiment, a countersink bit can be used to form an enlarged bore in the through-hole 100 having a larger diameter than a diameter of the via 102 and where the bore tapers slightly at the bore end that transitions to the via 102. In the embodiment of FIG. 4 (which shows a through-hole 100 similar to that shown in FIGS. 2A, 3A and 3B), the via 102 has a generally constant or uniform diameter or transverse cross-section along its length extending from the PCB top surface 22 to the selected depth within the PCB. In other embodiments, one or more micro-vias can be formed in combination with a blind, buried, or back-drilled through-hole bore.

The through-hole and/or via geometries can also be constructed in any suitable sizes and shapes, with constant or varying cross-sectional geometries along the lengths of the through-holes, depending upon design configurations or constraints for a particular product implementation.

Figure 5B:
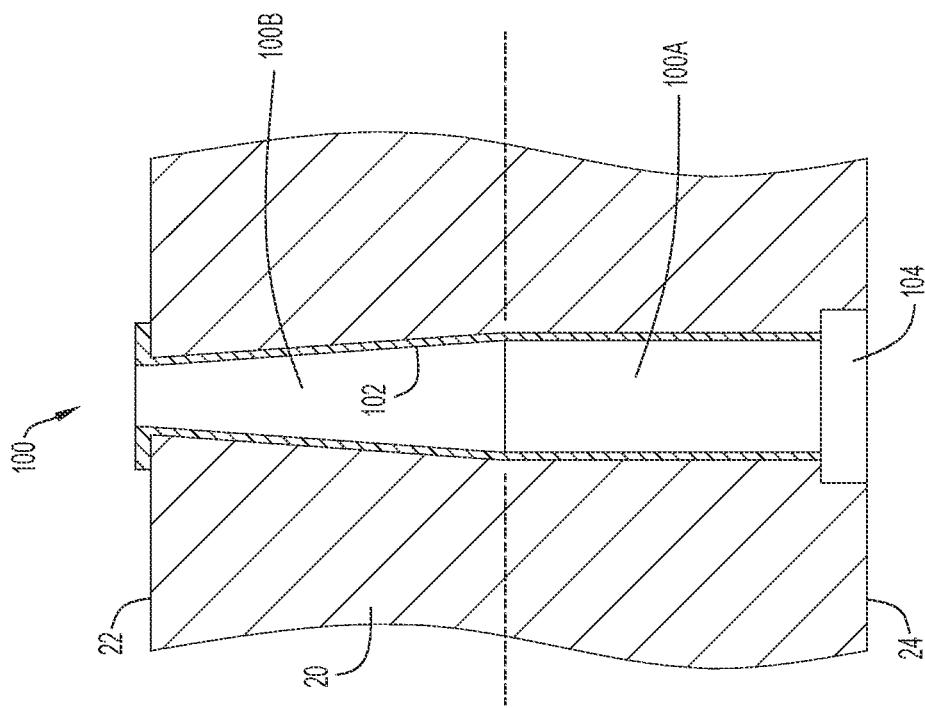
FIGS. 5A, 5B, 5C and 5D are additional schematic views of example embodiments showing different through-holes and vias that are constructed so as to be tapered and include a countersink or counterbore drill at the bottom surface of the PCB to facilitate engagement of pins of the cable interconnect assembly.
Figure 5A:
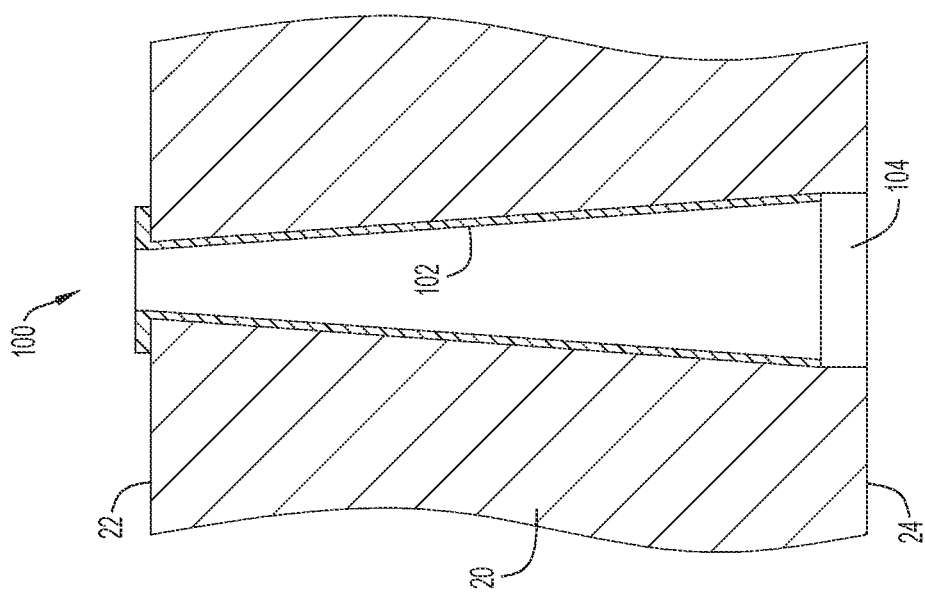
Figure 5D:
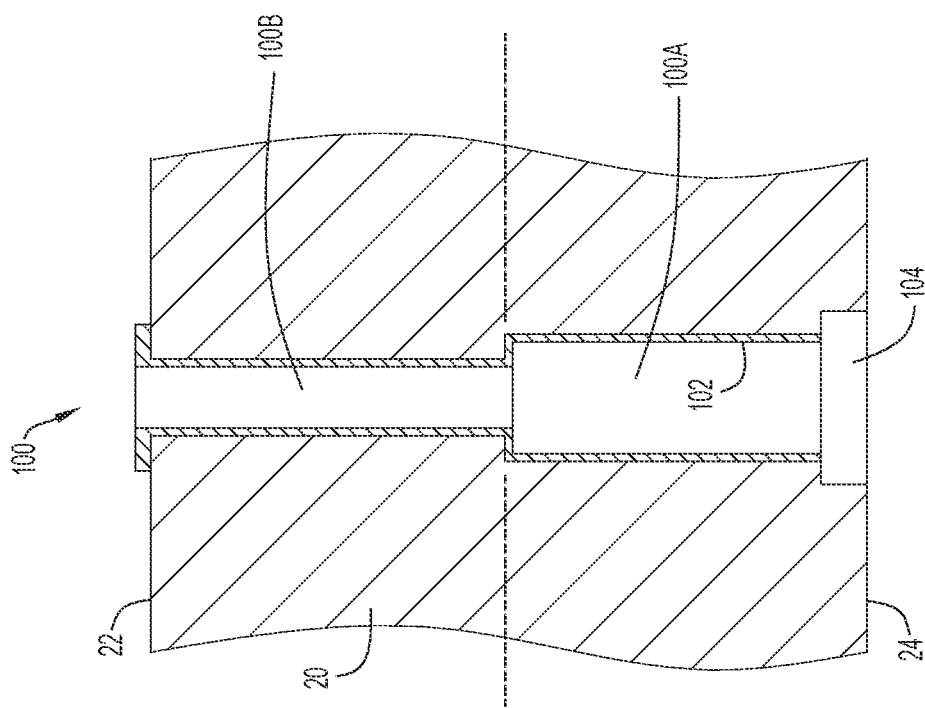
Figure 5C:
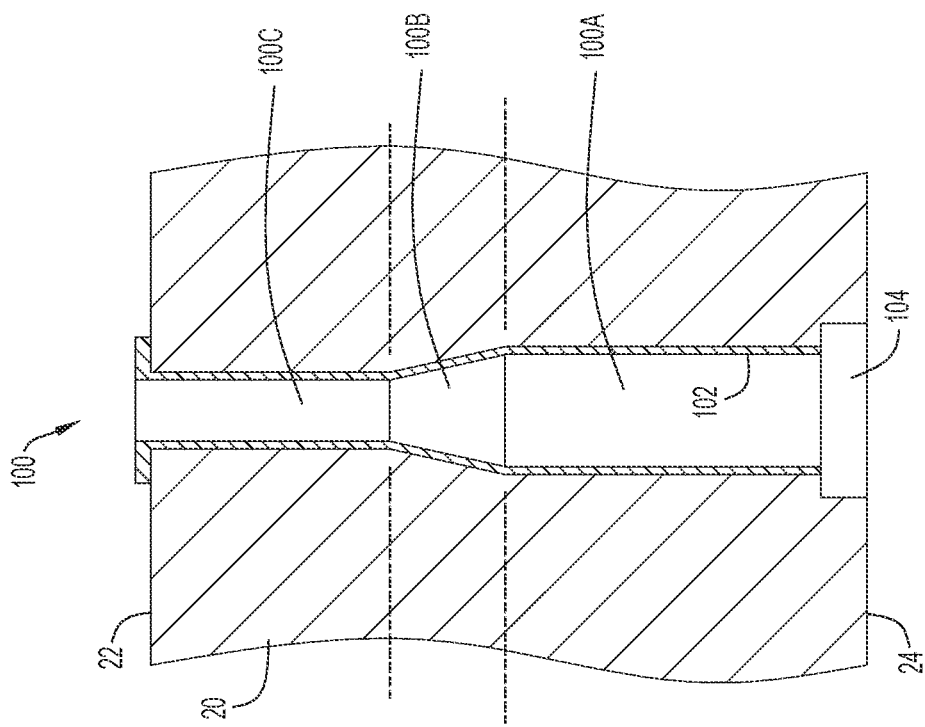

Further example embodiments of through-holes having varying transverse cross-sectional dimensions are depicted in FIGS. 5A-5D. Referring to FIG. 5A, a through-hole 100 for PCB 20 is depicted that tapers or decreases in transverse cross-section/diameter from the through-hole bore 104 and in a direction from the PCB bottom surface 24 to the PCB top surface 22. In FIG. 5B, a through-hole 100 includes a first through-hole segment 100A having a generally uniform or constant transverse cross-section/diameter and that extends from the through-hole bore 104 (located at the PCB bottom surface 24) to a selected depth within the through-hole 100. A second through-hole segment 100B (beginning at the broken line) has a tapered or decreasing transverse cross-section/diameter as the second through-hole segment extends from the first through-hole segment 100A to the PCB top surface 22. In still another embodiment of FIG. 5C, the through-hole 100 includes three sections that differ in transverse cross-section/diameter. The first through-hole segment 100A of FIG. 5C has a generally uniform or constant transverse cross-section/diameter and extends from the through-hole bore 104 (located at the PCB bottom surface 24) to a selected depth within the through-hole 100. A central or through-hole segment 100B (located between the two broken lines) has a tapered or decreasing transverse cross-section/diameter as the second through-hole segment extends from the first through-hole segment 100A to a third through-hole segment 100C. The third through-hole segment 100C has a generally uniform or constant transverse cross-section/diameter as the third through-hole segment extends from the second through-hole segment 100B to the PCB top surface 22. The transverse cross-section/diameter of the third through-hole segment 100C is less than the transverse cross-section/diameter of the first through-hole segment 100A. In another embodiment shown in FIG. 5D, a through-hole 100 includes a first through-hole segment 100A having a generally uniform or constant transverse cross-section/diameter and that extends from the through-hole bore 104 (located at the PCB bottom surface 24) to a selected depth within the through-hole 100. A second through-hole segment 100B (beginning at the broken line) also has a transverse cross-section/diameter that is constant as the second through-hole segment extends from the first through-hole segment 100A to the PCB top surface 22, but the second through-hole segment 100B has a smaller transverse cross-section/diameter than that of the first through-hole segment 100A. In each of FIGS. 5A-5D, the via 102 (i.e., conductive plating within the through-hole 100) can extend to any depth from the PCB top surface 22 into any tapered through-hole portion or any of the first, second and/or third through-hole segments 100A, 100B, 100C. Thus, the vias can also have changing diameters or transverse cross-sectional dimensions along the lengths of the vias.

In another example embodiment, a plurality (e.g., two or more) signal contacts associated with the ASIC (or other PCB integrated circuit component) can connect with a single via depending upon a particular application so as to allow for greater spacing between other signal contacts of the ASIC and corresponding vias in the PCB.

Figure 7:
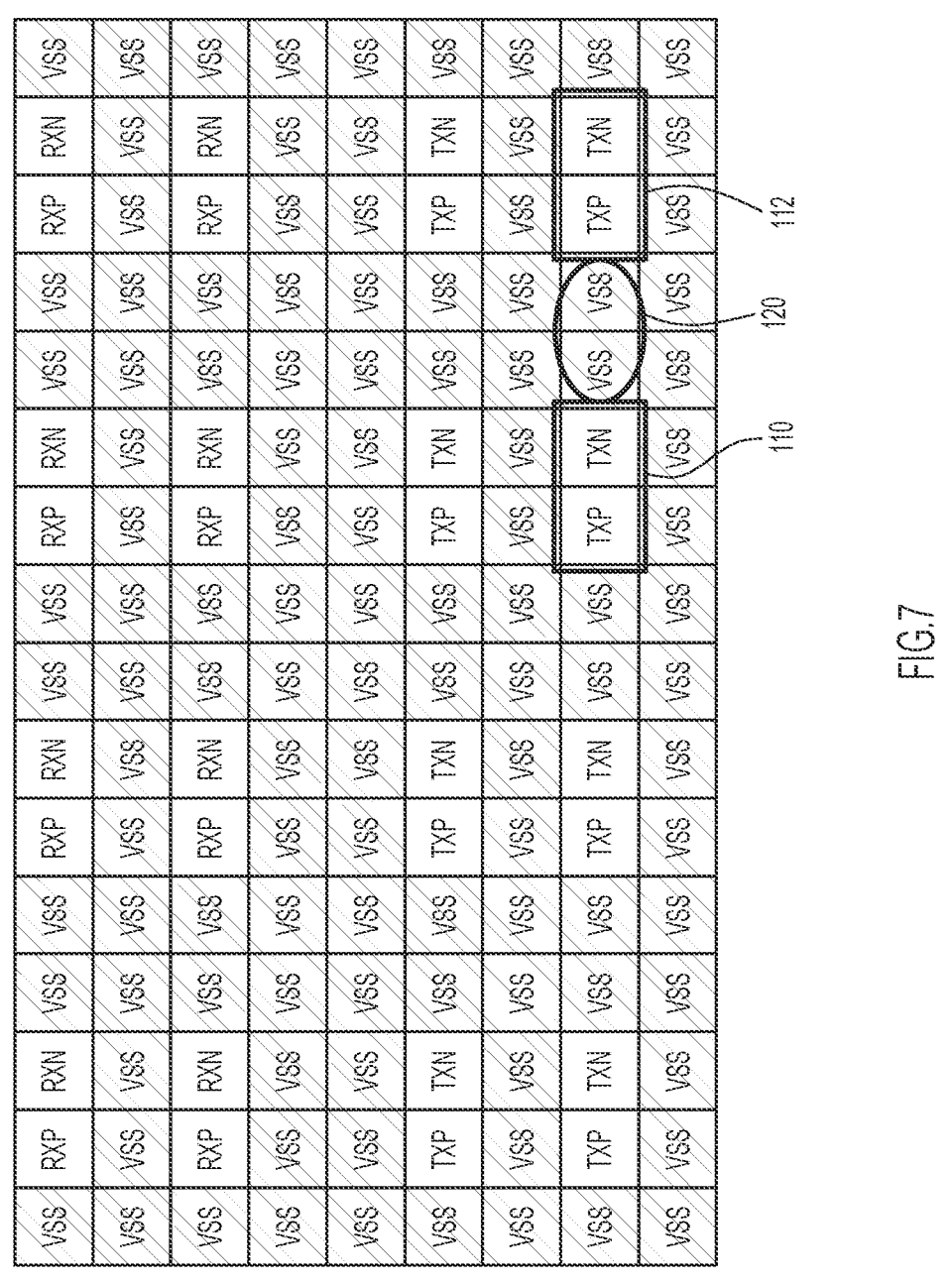

Referring to the example embodiment of FIGS. 6 and 7, the vias 102 within the PCB 20 allow for routing of differential signal pairs (P and N) in transmission (Tx) and receiver (Rx) signal lines in a very close pattern or arrangement (as shown in FIG. 7). This is facilitated by connecting two contact pads 26 (which engage with different balls of the BGA 35 for the ASIC 30) with a single via 102, as shown in circled area 120 on the PCB top surface 22. The contact pads 26 which share a single via 102 correspond or are mapped with ground (VSS) signal lines for the ASIC. The contact pads 26 which share a single via 102 are further located between contact pads 26 associated with two differential signal pairs (first differential signal pair 110 and second differential signal pair 112 as shown in FIGS. 6 and 7) of transmission signal lines (TXP and TXN). The sharing of a via for contact pads associated with ground (VSS) signal lines can be provided between each differential pair of transmission (TXP/TXN) signal lines and receiver (RXP/RXN) signal lines. This allows for greater spatial separation or distancing between TXP/TXN vias and RXP/RXN vias at the top surface and within the PCB due to fewer vias being required as a result of the via sharing. In particular, as shown in FIG. 6, the traces 28 connecting contact pads 26 with vias 102 for each differential pair (TXP/TXN or RXP/RXN) can be angled outward and away from each other such that a distance D1 between the vias 102 of a differential signal pair is greater than a distance D2 between the contact pads 26 for the differential signal pair.

Such mapping configuration of the vias (as shown in FIG. 6) results in a close or tight spacing between differential signal pairs that extend between the top and bottom surfaces of the PCB primarily within the vertically oriented vias, where (as previously noted) routing of signal lines horizontally along and/or within layers of the PCB is substantially eliminated. This facilitates mapping of individual differential pair bundles, as shown in FIG. 7, which can form a modular repeated element that can be placed into a housing in different positions to allow for Serializer/Deserializer (SERDES) lane mapping/swapping in the cables of the cable interconnect assembly rather than uncrossing of signal lines in the PCB routing.

The PCB via arrangement and corresponding signal mapping within the PCB and between the ASIC and cable interconnect assembly, as shown in FIGS. 6 and 7, further allows the cable interconnect assembly to be situated directly beneath the ASIC as shown in FIGS. 1-3. In particular, the PCB vias and signal mapping through the PCB can be configured so that the areal footprint or surface area of the PCB top surface 22 that facilitates the surface mount connection with the ASIC 30 is aligned with to overlie or contain the areal footprint or surface area of the PCB bottom surface 24 that facilitates the press-fit connection with the cable interconnect assembly 50.

Providing vias in the PCB that extend partially through the PCB at selected depths from the PCB top surface, combined with the geometries of through-holes, vias and the contact pins of the cable interconnect assembly, allows for a shortening of the length of the plated portions of the through-holes while ensuring suitable surface area contact between vias and pins of the cable interconnect assembly, thus improving signal transmission integrity and crosstalk performance between the ASIC and cable interconnect assembly. In particular, the PCB signal path mapping between ASIC and cable interconnect assembly results in a minimization of the signal path length being defined by the vertically aligned vias of the through-holes. In addition, each contact pad 26 can be provided at a close spatial distance from a corresponding via 102, thus minimizing horizontal signal path lengths by traces 28 and also the overall signal path distance between top and bottom surfaces of the PCB. This significantly reduces the requirement for complex routing and mapping of signal paths on and/or within the PCB, where such signal routing can be achieved in the wiring within the cables 56 of the cable interconnect assembly 50.

Further, the different via geometries (including tapered and/or other varied cross-sectional geometries), such as those depicted in FIGS. 4 and 5A-5D, can facilitate suitable size dimensions for the through-bores and vias, as well as suitable engagement and electrical contacting connections with the press-fit contact pins 54 of the cable interconnect assembly 50 for a particular PCB configuration. This in turn facilitates enhanced insertion performance of the contact pins 54 into the through-holes 100 and contact with the vias 102 and improvement of signal integrity during operations of the apparatus or device implementing the PCB.

In addition, a number of cost and performance advantages can be achieved utilizing the arrangement and configuration of vias within the PCB to transfer signals between ASIC and cable interconnect assembly. The cost savings opportunities include removal of re-timers from the PCB, the ability to use low cost PCB materials and copper finish, reducing the number of layers in the PCB (since signal re-routing is implemented in the cables of the cable interconnect assembly) and utilization of low cost technology space. Additional potential advantages include reducing the board size, improving PCB utilization and panelization, and having fewer voids in power planes leading to less DC voltage drop and thermal rise. There are also cooling advantages, since complex ASIC heat sink configurations would not be required since effective air flow at the PCB top surface can be achieved due to cable connectors being situated beneath the PCB (at the PCB bottom surface).

To summarize, the PCB configuration (including the ASIC pinout mapping for signals and via pattern in PCB as well as shortened plating lengths within through-holes) facilitates a number of advantages including, without limitation: larger press-fit vias to reduce interconnect cost/complexity while maintaining the proper impedance and return loss characteristics; substantially trace-free cable-to-ASIC interconnect which provides lower insertion loss; lower loss channels which allow for configuring SERDES operations for lower power consumption; cost saving by removal of PHY/re-timers and use low cost PCB materials); less PCB surface area real estate required around the ASIC; no heat sink modifications (e.g., heat sink to fin connector height) required to improve air flow and cooling of ASIC due to connectors and cable bundles being disposed on PCB bottom surface; improved power delivery to the ASIC; and allowing SERDES lane-to-lane swapping without adding cost for additional PCB layers (i.e., no additional PCB layers required, since differential signal pair routing is substantially achieved in the vertically aligned vias of the PCB). The embodiments described herein allow for implementation of high speed (e.g., 56 and 112 Gbps or higher) signaling in a cost effective manner for computing and networking equipment as well as other types of electronic devices.

Thus, in example embodiments, an apparatus comprises a printed circuit board (PCB) comprising a plurality of through-holes extending through the PCB between a PCB first surface and a PCB second surface that opposes the PCB first surface, where each through-hole includes a via extending from the PCB first surface to a depth within the through-hole that is distanced from the PCB second surface. An integrated circuit is surface mount connected at the PCB first surface with vias of the through-holes, and a cable interconnect assembly is surface mount connected at the PCB second surface. The cable interconnect assembly includes a plurality of contact pins, each contact pin extending within a corresponding through-hole and having a sufficient dimension to engage and electrically connect with the via of the corresponding through-hole so as to facilitate exchange of an electrical signal between the integrated circuit and the cable interconnect assembly.

Each through-hole and each via of the through-hole can have a transverse cross-section that changes along a length of the through-hole. Each through-hole can also have a tapered transverse cross-section such that a diameter of each through-hole decreases in a direction from the PCB second surface to the PCB first surface.

Further, each through-hole can have a plurality of segments having different transverse cross-sections. A first segment of each through-hole can have a constant diameter, and a second segment of each through-hole can have a changing diameter. A third segment of each through-hole can have a constant diameter that is less than the diameter of the first segment, and the second segment can be located between the first segment and the third segment.

The integrated circuit comprises an application specific integrated circuit (ASIC), the PCB includes contact pads that electrically connect with the vias of the through-holes, and the contact pads of the PCB connect with surface mount contacts of the ASIC. The surface mount contacts of the ASIC can comprise a ball grid array (BGA) of electrically conductive balls.

The contact pads and through-holes including vias are arranged in an array along the PCB first surface, and the array includes sets of contact pads, each set including a plurality of contact pads that electrically connect with a single via.

Each set of contact pads can further include contact pads corresponding with a first differential signal pair of electrical signals communicated between the ASIC and the cable interconnect assembly, contact pads corresponding with a second differential signal pair of electrical signals communicated between the ASIC and the cable interconnect assembly, and two contact pads can connect with a single via at a location between the contact pads corresponding with the first differential signal pair and the contact pads corresponding with the second differential signal pair.

The first PCB surface can include a first surface area within which the ASIC connects with the PCB, the second PCB surface can include a second surface area within which the cable interconnect assembly connects with the PCB, and the first surface area can at least partially overlie the second surface area.

An electronic device can include the apparatus as described herein.

In another embodiment, a printed circuit board (PCB) can comprise a plurality of through-holes extending through the PCB between a PCB first surface and a PCB second surface that opposes the PCB first surface, and the PCB can further comprise a plurality of vias, where each via extends from the PCB first surface to a depth within the through-hole that is distanced from the PCB second surface. A plurality of contact pads can be provided at the PCB first surface, where each contact pad is electrically connected with a corresponding via, and at least one via can electrically connect with a plurality of contact pads at the PCB first surface.

Each through-hole and each via of the through-hole can have a transverse cross-section that changes along a length of the through-hole. Each through-hole can have a tapered transverse cross-section such that a diameter of each through-hole decreases in a direction from the PCB second surface to the PCB first surface. Further, each through-hole can have a plurality of segments having different transverse cross-sections.

The contact pads and through-holes including vias can be arranged in an array along the PCB first surface, and the array can include sets of contact pads, each set including a plurality of contact pads that connect with a single via. Each set of contact pads can further include contact pads corresponding with a first differential signal pair of electrical signals communicated between an integrated circuit that mounts at the first PCB surface and a cable interconnect assembly that mounts at the second PCB surface, contact pads corresponding with a second differential signal pair of electrical signals communicated between the integrated circuit and the cable interconnect assembly, and two contact pads can connect with a single via at a location between the contact pads corresponding with the first differential signal pair and the contact pads corresponding with the second differential signal pair.

In a further embodiment, a method can comprise mounting an integrated circuit component to a PCB first surface of a printed circuit board (PCB) such that the integrated circuit component connects with contact pads at the PCB first surface, where the PCB comprises a plurality of through-holes extending through the PCB between the PCB first surface and a PCB second surface that opposes the PCB first surface, and each through-hole includes a via extending from the PCB first surface to a depth within the through-hole that is distanced from the PCB second surface, each via further connecting with a corresponding contact pad at the PCB first surface. The method can further comprise facilitating a connection of a cable interconnect assembly at the PCB second surface, the cable interconnect assembly including a plurality of contact pins, each contact pin extending within a corresponding through-hole and having a sufficient dimension to engage and electrically connect with the via of the corresponding through-hole so as to facilitate exchange of an electrical signal between the integrated circuit and the cable interconnect assembly.

In the method, the contact pads and through-holes including vias can arranged in an array along the PCB first surface, and the array includes sets of contact pads, each set including a plurality of contact pads that electrically connect with a single via.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An apparatus comprising:
   a printed circuit board (PCB) comprising a plurality of through-holes extending through the PCB between a PCB first surface and a PCB second surface that opposes the PCB first surface, wherein each through-hole includes a via extending from the PCB first surface to a depth within the through-hole that is distanced from the PCB second surface;
   an integrated circuit surface mount connected at the PCB first surface with vias of the through-holes; and
   a cable interconnect assembly surface mount connected at the PCB second surface, the cable interconnect assembly including a plurality of contact pins, each contact pin extending within a corresponding through-hole and having a sufficient dimension to engage and electrically connect with the via of the corresponding through-hole so as to facilitate exchange of an electrical signal between the integrated circuit and the cable interconnect assembly.

2. The apparatus of claim 1, wherein each through-hole and each via of the through-hole has a transverse cross-section that changes along a length of the through-hole.

3. The apparatus of claim 1, wherein each through-hole has a tapered transverse cross-section such that a diameter of each through-hole decreases in a direction from the PCB second surface to the PCB first surface.

4. The apparatus of claim 1, wherein each through-hole has a plurality of segments having different transverse cross-sections.

5. The apparatus of claim 4, wherein a first segment of each through-hole has a constant diameter, and a second segment of each through-hole has a changing diameter.

6. The apparatus of claim 5, wherein a third segment of each through-hole has a constant diameter that is less than the diameter of the first segment, and the second segment is located between the first segment and the third segment.

7. The apparatus of claim 1, wherein the integrated circuit comprises an application specific integrated circuit (ASIC), the PCB includes contact pads that electrically connect with the vias of the through-holes, and the contact pads of the PCB connect with surface mount contacts of the ASIC.

8. The apparatus of claim 7, wherein the surface mount contacts of the ASIC comprise a ball grid array (BGA) of electrically conductive balls.

9. The apparatus of claim 7, wherein the contact pads and through-holes including vias are arranged in an array along the PCB first surface, and the array includes sets of contact pads, each set including a plurality of contact pads that electrically connect with a single via.

10. The apparatus of claim 9, wherein each set of contact pads further includes:
contact pads corresponding with a first differential signal pair of electrical signals communicated between the ASIC and the cable interconnect assembly;
contact pads corresponding with a second differential signal pair of electrical signals communicated between the ASIC and the cable interconnect assembly; and
two contact pads connect with a single via at a location between the contact pads corresponding with the first differential signal pair and the contact pads corresponding with the second differential signal pair.

11. The apparatus of claim 7, wherein the first PCB surface includes a first surface area within which the ASIC connects with the PCB, the second PCB surface includes a second surface area within which the cable interconnect assembly connects with the PCB, and the first surface area at least partially overlies the second surface area.

12. An electronic device including the apparatus of claim 1.

13. A printed circuit board (PCB) comprising:
a plurality of through-holes extending through the PCB between a PCB first surface and a PCB second surface that opposes the PCB first surface;
a plurality of vias, wherein each via extends from the PCB first surface to a depth within the through-hole that is distanced from the PCB second surface; and
a plurality of contact pads at the PCB first surface, wherein each contact pad is electrically connected with a corresponding via;
wherein at least one via electrically connects with a plurality of contact pads at the PCB first surface.

14. The PCB of claim 13, wherein each through-hole and each via of the through-hole has a transverse cross-section that changes along a length of the through-hole.

15. The PCB of claim 13, wherein each through-hole has a tapered transverse cross-section such that a diameter of each through-hole decreases in a direction from the PCB second surface to the PCB first surface.

16. The PCB of claim 13, wherein each through-hole has a plurality of segments having different transverse cross-sections.

17. The PCB of claim 13, wherein the contact pads and through-holes including vias are arranged in an array along the PCB first surface, and the array includes sets of contact pads, each set including a plurality of contact pads that connect with a single via.

18. The PCB of claim 17, wherein each set of contact pads further includes:
contact pads corresponding with a first differential signal pair of electrical signals communicated between an integrated circuit that mounts at the first PCB surface and a cable interconnect assembly that mounts at the second PCB surface;
contact pads corresponding with a second differential signal pair of electrical signals communicated between the integrated circuit and the cable interconnect assembly; and
two contact pads connect with a single via at a location between the contact pads corresponding with the first differential signal pair and the contact pads corresponding with the second differential signal pair.

19. A method comprising:
mounting an integrated circuit component to a PCB first surface of a printed circuit board (PCB) such that the integrated circuit component connects with contact pads at the PCB first surface, wherein the PCB comprises a plurality of through-holes extending through the PCB between the PCB first surface and a PCB second surface that opposes the PCB first surface, and each through-hole includes a via extending from the PCB first surface to a depth within the through-hole that is distanced from the PCB second surface, each via further connecting with a corresponding contact pad at the PCB first surface; and
facilitating a connection of a cable interconnect assembly at the PCB second surface, the cable interconnect assembly including a plurality of contact pins, each contact pin extending within a corresponding through-hole and having a sufficient dimension to engage and electrically connect with the via of the corresponding through-hole so as to facilitate exchange of an electrical signal between the integrated circuit and the cable interconnect assembly.

20. The method of claim 19, wherein the contact pads and through-holes including vias are arranged in an array along the PCB first surface, and the array includes sets of contact pads, each set including a plurality of contact pads that electrically connect with a single via.

* * * * *